United States Patent [19]
Kamiya

[11] Patent Number: 5,790,253
[45] Date of Patent: Aug. 4, 1998

[54] METHOD AND APPARATUS FOR CORRECTING LINEARITY ERRORS OF A MOVING MIRROR AND STAGE

[75] Inventor: Saburo Kamiya, Ichikawa, Japan

[73] Assignee: Nikon Corporation, Tokyo, Japan

[21] Appl. No.: 820,502

[22] Filed: Apr. 4, 1997

[30] Foreign Application Priority Data

Apr. 5, 1996 [JP] Japan ................................ 8-110281

[51] Int. Cl.$^6$ ................................................ G01B 9/02
[52] U.S. Cl. ........................... 356/363; 356/400; 356/358
[58] Field of Search .................................. 356/358, 363, 356/400, 401; 250/559.3, 559.37

[56] References Cited

U.S. PATENT DOCUMENTS

| | | | |
|---|---|---|---|
| 5,151,749 | 9/1992 | Tanimoto et al. | 356/358 |
| 5,440,397 | 8/1995 | Ono et al. | 356/358 |
| 5,532,822 | 7/1996 | Shinozaki et al. | 356/363 |
| 5,563,708 | 10/1996 | Nakai | 356/363 |

FOREIGN PATENT DOCUMENTS 59-98446 7/1984 Japan.
4-142438 5/1992 Japan.

Primary Examiner—Samuel A. Turner
Attorney, Agent, or Firm—Michael N. Meller

[57] ABSTRACT

To accurately correct the deformation component of a moving mirror on a wafer stage measure the curving data of the moving mirrors prior to the installation onto the wafer stage and store the data as a function of the distance from one end of the mirror. Then, measure the discrete curving error data of the moving mirrors after installation onto the wafer stage at every distance, d, using two laser interferometers arranged in parallel at a distance, d. Store the measurement results in the memory. Finally, a main controller creates a continuous curving error data of the moving mirror after installation onto the wafer stage based on the relationship between curving data and curving error data of the moving mirror before and after installation onto the above wafer stage to use it as the correction data.

12 Claims, 5 Drawing Sheets

METHOD AND APPARATUS FOR CORRECTING LINEARITY ERRORS OF A MOVING MIRROR AND STAGE

BACKGROUND OF THE INVENTION

The present invention relates to a method and apparatus for correcting linearity errors of a moving mirror and a stage system. More specifically, the present invention relates to a method and apparatus for correcting linearity errors of a moving mirror mounted on a stage, for measuring the position of a stage by means of laser beams irradiated from laser interferometers, and relates to a stage system to which the correction method is applied.

A type of XY stage for retaining an object and precisely moving the stage in each of the directions of two axes (X- and Y-axes) perpendicular to each other is used in various apparatus for transfer of VLSI (Very Large-Scale Integrated Circuit) patterns. This includes exposure apparatus (steppers, and the like), apparatus for drawing transfer masks, apparatus for measuring coordinates of mask pattern positions and other apparatus for positioning. For measuring the coordinates of the XY stage, a light wave interferometer (laser interferometer) is normally used having a helium-neon frequency-stabilized laser as a light source capable of continuously oscillating at a wavelength of 633 nm.

Essentially, one laser interferometer enables one-dimensional measurement alone. Two identical laser interferometers are therefore used for two-dimensional measurement. Two plane mirrors having reflecting surfaces perpendicular to each other are fixed on the XY stage. Two beams are respectively projected from the laser interferometers onto the two plane mirrors, and the change in the stage position in the direction perpendicular to each reflecting mirror surface is measured to calculate the two-dimensional coordinate position of the stage. The reflecting surfaces of the two moving mirrors respectively extend in the X- and Y-directions to allow the necessary movement of the stage by stroke intervals. These moving mirrors are used as a basis for coordinate measurement and the reflecting surfaces must have a very high degree of flatness.

The measurement resolution of the laser interferometer is about 0.01 μm, and the necessary length of the reflecting surface of each moving mirror is about 250 mm in the case of a stage on which a 6-inch semiconductor wafer is placed. That is, if the whole reflecting surface having a length of 250 mm is inclined or has small curved sections or is non-flat and if the deviation from the reference plane is larger than 0.01 μm, this deviation is included in the value of the measurement using the laser interferometer, causing measurement errors.

In recent manufacturing of semiconductor integrated circuits, as the degree of integration increases, the size of circuit patterns has been reduced. This requires an increase in accuracy in overlaying of interlayers of circuit elements. Alignment of the shot regions on a wafer is one of the most impacting factors for overlay precision. If there is any measurement error using the laser interferometer, the alignment accuracy of the shot region is determined based on the error, resulting in poor alignment accuracy.

To cope with the problems a conventional technique was proposed as disclosed in Japanese Utility Model S59-94446, in which a coordinate error map is created using the results of calculating linearity errors of a moving mirror in advance, according to the position of a stage, which is used as a basis for correcting the position of the wafer stage.

In this related art, two laser interferometers whose two measuring length axes are separated by a distance, d, are arranged on a wafer stage which moves in X- and Y-directions perpendicular to each other within a two-dimensional plane for measuring the coordinate positions of the wafer stage in the X- and Y-directions.

When measuring the linearity errors of a moving mirror in the direction of the X-axis of a wafer stage, the Y-axis coordinate position is maintained constant. The moving mirror is moved by the distance, d, step-by-step in the direction of the X-axis for measuring the amount of displacement using two laser interferometers provided in the direction of the Y-axis to calculate the discrete data of curving errors in the distance, d, in the moving mirror formed in the direction of the X-axis of the wafer stage. At the same time, by calculating the difference for the measuring length axes of the two laser interferometers provided in the direction of the X-axis for each of the steps, the extent of yawing from the measured value is measured. In addition, by correcting the curving errors for each distance, d, in the moving mirror formed in the direction of the X-axis of the wafer stage using the amount of the extent of yawing, the linearity errors of the moving mirror formed along the X-axis direction can be obtained.

When measuring linearity errors of another moving mirror in the Y-axis direction of the wafer stage, its X- and Y-axes are reversed compared to the Y-side moving mirror formed in the direction of the X-axis. The linearity error of the moving mirror in the direction of the Y-axis can be obtained by:

moving the wafer stage in the Y-direction by the distance, d, step-by-step to measure the discrete data of curving errors for each of the distances, d, of the moving error formed in the direction of the Y-axis.

taking the difference data measured using the two laser interferometers provided in the direction of the Y-axis to measure the extent of yawing; and correcting the data of curving errors in the moving mirror formed in the direction of the Y-axis.

In the conventional method of correcting linearity errors of moving mirrors, the linearity errors for the distance, d, between the measuring length axes can be measured. However, the linearity errors within the distance, d, between the measuring length axes cannot be fundamentally measured.

In a normal measurement of displacement of a wafer stage, a laser interferometer is constructed with a corner cube prism provided on the side of a polarized beam splitter to set up a "double-path" (the system which returns the optical path twice) so that the position of the stage can be measured accurately even if its angle is changed. When the optical system is constructed with this "double-path," the distance, d, between the measuring length axes of two laser interferometers arranged in parallel will be at least 30 mm or more due to the limitation of optical components. Accordingly, the linearity errors can be measured only at an interval of 30 mm or more.

When measuring linearity errors of a moving mirror by means of a laser interferometer having two measuring length axes, it appears to be possible to measure the errors within the distance between the measuring length axes (for example, 30 mm) if the moving mirror is shifted by less than the distance between the measuring length axes (for example, 15 mm). When measuring the amount of displacement by shifting the moving mirror by the distance between the measuring length axes such that the measurement points of the axes overlap, the linearity errors which indicate the curving of the reflecting surface of the moving mirror can be obtained due to the relationship of adjacent measurement values.

3

However, when measuring the amount of displacement by shifting the moving mirror by less than the distance between the measuring length axes, the measurement points do not overlap. Therefore, the relationship is not established between the adjacent measurement values. The result is that the linearity errors of the reflecting surface of the moving mirror is not obtained. For this reason, the measurement of linearity errors of the moving mirror is limited by the distance between the measuring length axes.

When manufacturing a conventional semiconductor integrated circuit of small integration, this distance (30 mm) is sufficient from the view of overlay precision. However, this distance (30 mm) is not sufficient for recent projection exposure apparatus for large integration having a circuit line width on the order of a half micron or less.

In a conventional method of correcting linearity errors of a moving mirror, it is necessary to minimize errors as much as possible during the manufacturing process of the mirror surface. This includes, for example, a wave with an amplitude of 30 mm or less. However, it is difficult, due to the characteristics of the mirror manufacturing process, to process the moving mirror while maintaining high accuracy throughout the entire mirror surface and minimizing deviation of a high-range frequency and the amplitude of the wave.

In a conventional projection exposure apparatus, moving mirrors with corrected errors are still required for high accuracy to the same degree required for mirrors without corrected linearity errors. This increases the process time and cost for producing the mirror surface.

SUMMARY OF THE INVENTION

Accordingly, it is an object of the present invention to overcome the problems present in the prior art solutions.

The present invention is devised taking account of such drawbacks in the conventional technology. It is an object of the present invention to provide a method and apparatus for correcting linearity errors of a moving mirror. The correction is performed on the component of deformation caused when fixing the S moving mirror onto the stage and on the wavy component or unevenness of less than the distance between the measuring length axes of a laser interferometer, caused when the moving mirror is manufactured.

A further object of the present invention is to provide a method of correcting linearity errors of a moving mirror provided on a stage movable in a two-dimensional plane along first and second mutually perpendicular axes. The mirror extends in a first axial direction and the method includes the steps of measuring any shaping errors of the reflecting surface of the mirror before the mirror is installed on the stage. The data resulting from such measurement is stored in a memory as data which is a function of the distance from one end of the moving mirror. The mirror is mounted on the stage in a preselected position and the stage is moved in the first axial direction. The discrete curving errors data of the reflecting surface of the mirror is measured as the stage is moved in the first axial direction. This measurement is carried out by means of a laser interferometer having at least two measuring length axes separated by a predetermined interval in the first axial direction. The discrete curving errors data of the mirror is measured for the interval between the measuring length axes. The discrete curving errors data of the mirror is stored in a memory. Finally, the discrete curving errors data of the reflecting surface of the mirror is combined with the data which is a function of the distance from one end of the moving mirror, based on the relative positional relationship between the measuring length axes and the preselected position on the stage where the moving mirror is mounted to create a series of correction data for correcting linearity errors of the moving mirror.

A further preferred method includes the steps of measuring the amount of displacement of the stage in the rotational direction when the stage is moved in the first axial direction and storing, in the memory, the difference between the component of displacement in the rotational direction and the discrete curving errors data of the reflecting surface of the mirror.

In still another method including the principles of the present invention, the measurement of the discrete curving errors data of the mirror by the laser interferometer measures the difference between data measured at each of the positions of the measuring length axes.

In a method incorporating the principles of the present invention, the shaping errors of the reflecting surface of the mirror are measured by a Fizeau interferometer.

Apparatus incorporating the principles of the present invention includes a stage system having a stage movable in a two-dimensional plane along first and second mutually perpendicular axes. Means are included for measuring the discrete data of curving errors in the reflecting surface of a moving mirror before the mirror is mounted on the stage. A storage means is provided for storing the discrete data of curving errors as data which is a function of the distance from one end of the moving mirror. Means are also included for mounting the moving mirror along the first axial direction of the stage at a predetermined position. A laser interferometer is provided for irradiating the moving mirror with at least two parallel axes measuring beams at a predetermined distance in the first axial direction. Correction data-producing means are included which produces a series of correction data for correcting linearity errors of the moving mirror, the correction data-producing means including means for measuring the discrete data of curving errors in the reflecting surface of the moving mirror for each interval between the measuring axes, based on the output from the laser interferometer, while moving the stage in the first axial direction. Finally, a controller is provided for combining the discrete data of curving errors with the data which is a function of the distance from one end of the moving mirror stored in the storage means, based on the relative positional relationship between the measuring axes and the predetermined position where the moving mirror is mounted, to create a series of correction data for correcting linearity errors of the moving mirror.

BRIEF DESCRIPTION OF THE DRAWINGS

The above and other objects, features, and advantages of the present invention will become more apparent from the following detailed description taken with the accompanying drawings, in which:

FIGS. 4(a), 4(b), and 4(c), show graphical waveforms explaining the principle of creating correction data for correcting linearity errors of a moving mirror.

DESCRIPTION OF THE PREFERRED EMBODIMENTS

Figure 1:
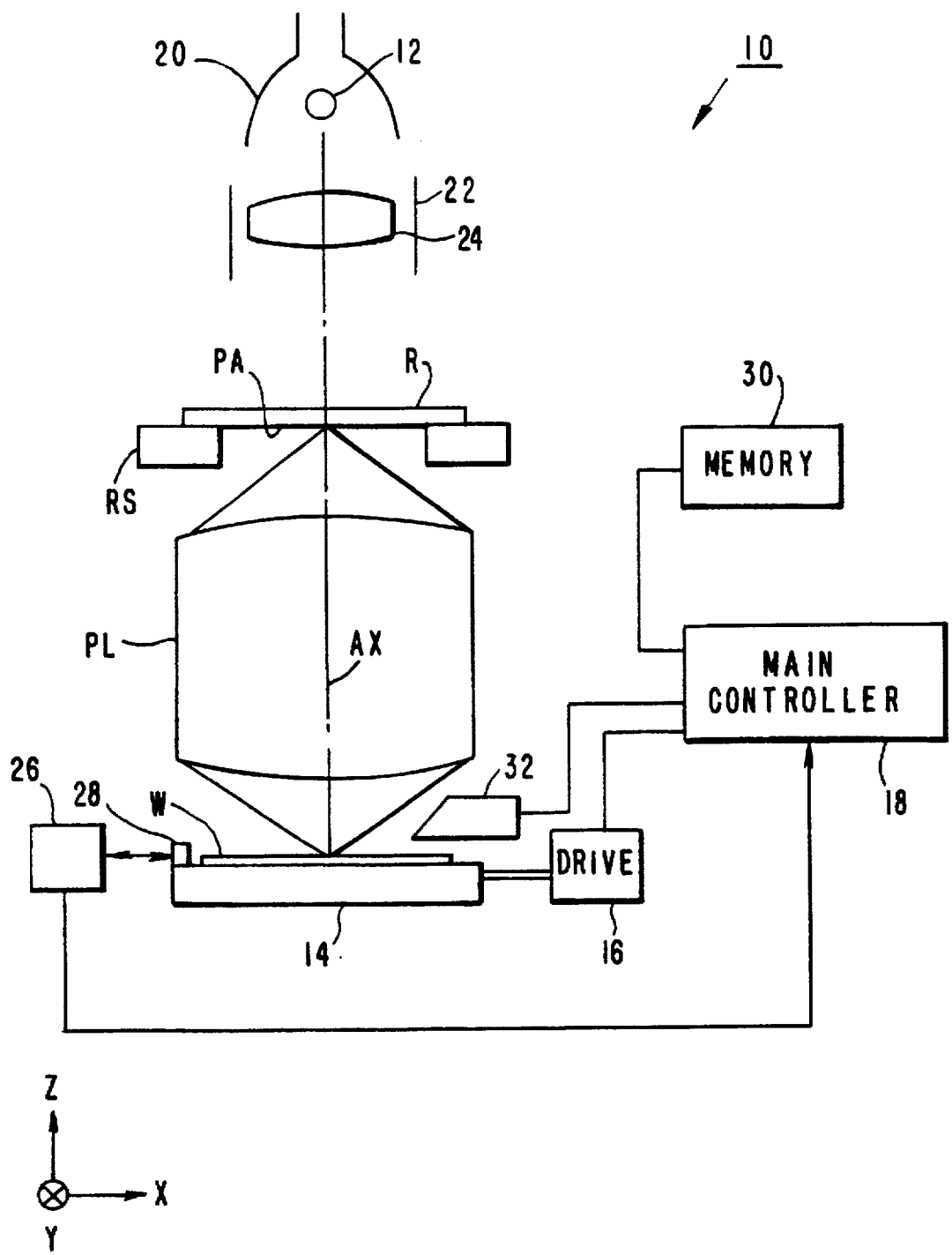
FIG. 1 is schematic diagram showing the configuration of a step-and-repeat exposure apparatus utilized in an embodiment of the present invention.

Referring to the drawings, FIG. 1 shows a schematic diagram of a step-and-repeat exposure apparatus 10 relating to a first embodiment of the present invention. The exposure apparatus 10 comprises an illumination light system including a light source 12; a reticle stage RS on which a reticle R is loaded; a projection lens system PL which superimposingly photoprints a circuit pattern from the reticle R onto the photosensitive surface of a wafer W; a wafer stage 14 on which the wafer W is loaded; a wafer stage driving system 16 which moves the wafer stage 14 within a horizontal plane, a main controller 18 which controls the system as a whole including the wafer stage driving system 16; a laser interferometer 26 which assures the coordinate positions of the wafer stage 14; a moving mirror 28 fixed on the wafer stage 14, which reflects beams (measuring beams) from the laser interferometer; a memory 30; and a wafer alignment microscope 32, etc.

The illumination light system comprises a light source 12 consisting of a mercury lamp, an oval mirror 20, and an illumination light system 22. The illumination light system 22 is illustrated as having only a single lens 24 in the figure. However, system 22 actually comprises various lenses such as a fly-eye lens, a relay lens, and a condenser lens, all of which are represented by the lens 24 in FIG. 1. System 22 also includes a shutter, not illustrated, a field stop, and a blind. In this configuration, illumination light emitted from the light source 12 is condensed at a second focus by the oval mirror 20 and enters the illumination light system 22, by means of which the illumination light is turned into a uniform optical flux and speckle levels are reduced. The light is then illuminated onto a pattern surface PA of the reticle R.

The reticle R is held on the reticle stage RS. The aforementioned circuit pattern is drawn on the pattern surface PA of the reticle R.

The aforementioned projection lens system PL comprises a plurality of lens elements arranged at a predetermined distance along the direction of an optical axis AX (in the direction of the Z-axis in FIG. 1) which is common to all the elements and a lens cylinder which holds these lens elements.

The wafer stage 14 is driven in the two-dimensional directions of X (parallel direction to FIG. 1) and Y (perpendicular direction to FIG. 1) axes within a horizontal plane by the wafer stage driving system 16. Also, the moving mirror 28 comprising a plane mirror of a predetermined length is formed on the wafer stage 14 to measure positions of the wafer stage 14 using the laser interferometer 26 which projects a light beam onto the moving mirror.

In reality, there are two moving mirrors, 28A and 28B (see FIG. 2) formed for measuring positions of the stage 14 in the directions of X- and the Y-axes respectively. There are two interferometers 26A, 26B, and 26C, 26D formed for measuring positions of the stage 14 in the directions of X- and Y-axes respectively. However, FIG. 1 shows only representatives of these groups of components referring to the moving mirror 28 and the laser interferometer 26. The arrangement and the like of these moving mirrors and laser interferometers will be discussed later.

The main controller 18 comprises a ROM (Read-Only Memory) which stores control programming, a RAM (Random-Access Memory) which is formed of the work areas and the like needed to control operation, and a microcomputer (or referred to as a minicomputer) which controls the CPU (Central Processing Unit) which controls the entire operation of the exposure system 10 using these memories. The main controller 18 also is connected to the memory 30 serving as an external storage means.

In the memory 30, stored in this embodiment, are data and the like which allow the calculation of parameters needed to correct linearity errors such as the data on the reflecting surface shape of the moving mirror 28 (moving mirrors 28A, 28B). Such data is measured before the moving mirror is mounted onto the stage 14 using a Fizeau interferometer to be described later.

The wafer alignment microscope 32 detects the positioning mark (alignment mark) formed on the wafer W loaded on the wafer stage 14 and the results of such detection are put into the main controller 18.

Figure 2:
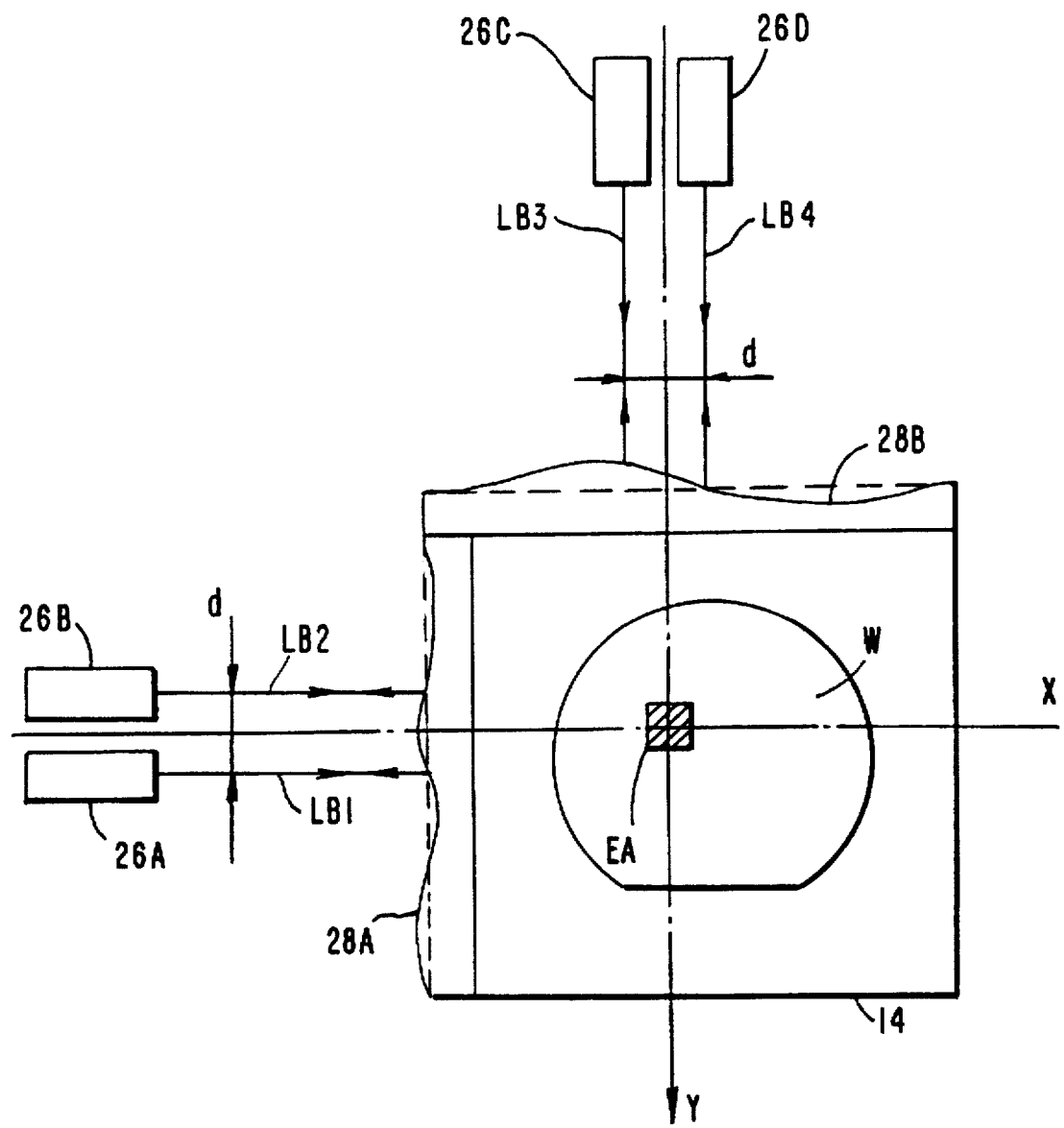
FIG. 2 is a plan view showing the positional relationship between a wafer stage and laser interferometers of FIG. 1.

FIG. 2 shows a plan view of the wafer stage 14 of FIG. 1 and its surrounding apparatus. The wafer stage 14 of FIG. 2 is movable in the two axial directions, X (right and left) and Y (up and down) axes perpendicular to each other in a two-dimensional plane. A moving mirror 28A for measuring the stage 14 positions in the direction of the X-axis is formed on an edge in the direction of the Y-axis of the front surface of the wafer stage 14. Another moving mirror 28B is formed on an edge of the stage 14 in the direction of the X-axis for measuring the stage 14 positions in the direction of the Y-axis.

Laser interferometers 26A, 26B for measuring the stage positions in the direction of the X-axis are arranged opposite the moving mirror 28A for measuring the same in the direction of the X-axis. Measuring beams LB1, LB2 are irradiated, respectively, from the interferometers 26A, 26B onto the moving mirror 28A. The distance between these measuring beams LB1, LB2 is illustrated as the distance, d.

Positions of the moving mirror 28A using the laser interferometers 26A, 26B are measured as follows. A beam is irradiated onto the moving mirror 28A fixed onto the wafer stage 14 and onto a fixed mirror (not illustrated in FIG. 2) mounted at a reference position. Taking into account the interference belts generated where the reflections are combined, a displacement amount from the reference position is measured. Positions in the direction of the X-axis on the wafer stage (coordinate positions) are calculated by averaging the values of the measured distances for each of the laser interferometers 26A, 26B.

In the same manner, the laser interferometers 26C, 26D for measuring the stage positions in the direction of the Y-axis are arranged opposite the moving mirror 28B for measuring positions in the direction of the Y-axis. Measuring beams LB3, LB4 are irradiated, respectively, from the interferometers 26C, 26D onto the moving mirror 28B. The distance between the measuring beams LB3, LB4 is illustrated as the distance, d.

Note that the measurement of the moving mirror 28B taken by the laser interferometers 26C, 26D is the same as that taken by the aforementioned laser interferometers 26A, 26B. Taking into account the interference belts generated between the moving mirror and the fixed mirror (not illustrated), a displacement amount from the reference position is measured. Positions in the direction of the Y-axis (coordinate positions) on the wafer stage are calculated by averaging the values of measured distances for each of the laser interferometers 26A, 26B.

When calculating the levels of yawing of the wafer stage 14 using the aforementioned laser interferometers 26A, 26B, and 26C, 26D, the averages of differences between the laser interferometers 26A and 26B and that between 26C and 26D are calculated.

Note that as shown in FIG. 2, the aforementioned laser interferometers 26A and 26B, and 26C and 26D can be constructed as separate interferometers. However, an interferometer having two measuring length axes can be used. The wafer W on the wafer stage 14 is fixed on the wafer holder and the like by vacuum and the like.

Figure 3:
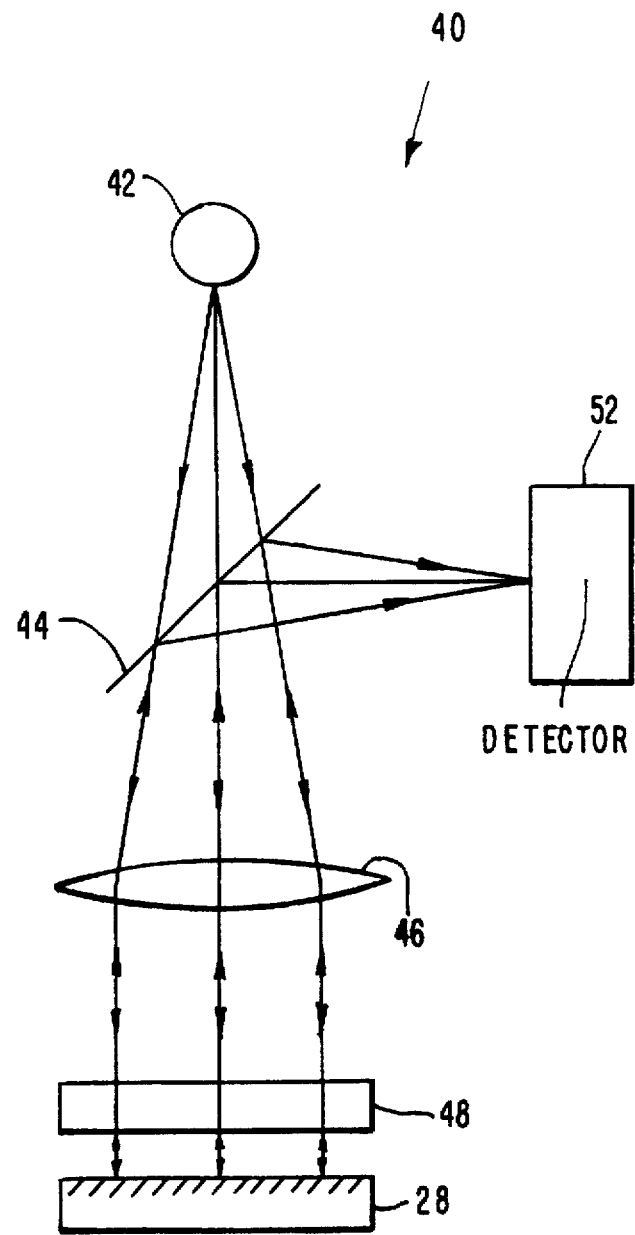
FIG. 3 is a schematic diagram showing the configuration of a Fizeau interferometer for measuring curving errors on the entire reflecting surface of a moving mirror prior to its installation onto a wafer stage.

FIG. 3 shows a schematic diagram of a Fizeau interferometer 40 for measuring curving or shaping errors of the entire reflecting surface of a moving mirror 28 before the mirror is mounted on the wafer stage. The Fizeau interferometer 40 comprises a light source 42, a beam splitter 44, a Fizeau lens 46, a reference plane 48, and an interference belt detector 52, and the like.

As shown in FIG. 3, a beam emitted from the light source 42 of the Fizeau interferometer 40 passes through the beam splitter 44 to form parallel beams at the Fizeau lens 46. The parallel beams pass through the reference plane 48 to be irradiated onto the reflecting surface of the moving mirror 28. The reflecting light from the reflecting surface of the reference plane 48 and the moving mirror 28 goes through the Fizeau lens 46 to be condensed until it reaches the beam splitter 44. It is reflected from the splitter 44 toward the interference belt detector 52. The interference belt detector 52 detects the interference belt resulting from synthesized reflections from both the reflecting surfaces of the reference plane 48 and the moving mirror 28 for analysis. In this way, a series of curving (shapes) of the reflecting surface of the moving mirror 28 can be measured. The measurements using the aforementioned Fizeau interferometer 40 are performed for each of the moving mirrors 28A and 28B.

The use of a Fizeau interferometer makes it possible to measure surface curving data more accurately with less optical components compared to a Twyman-Green interferometer.

Figure 4:
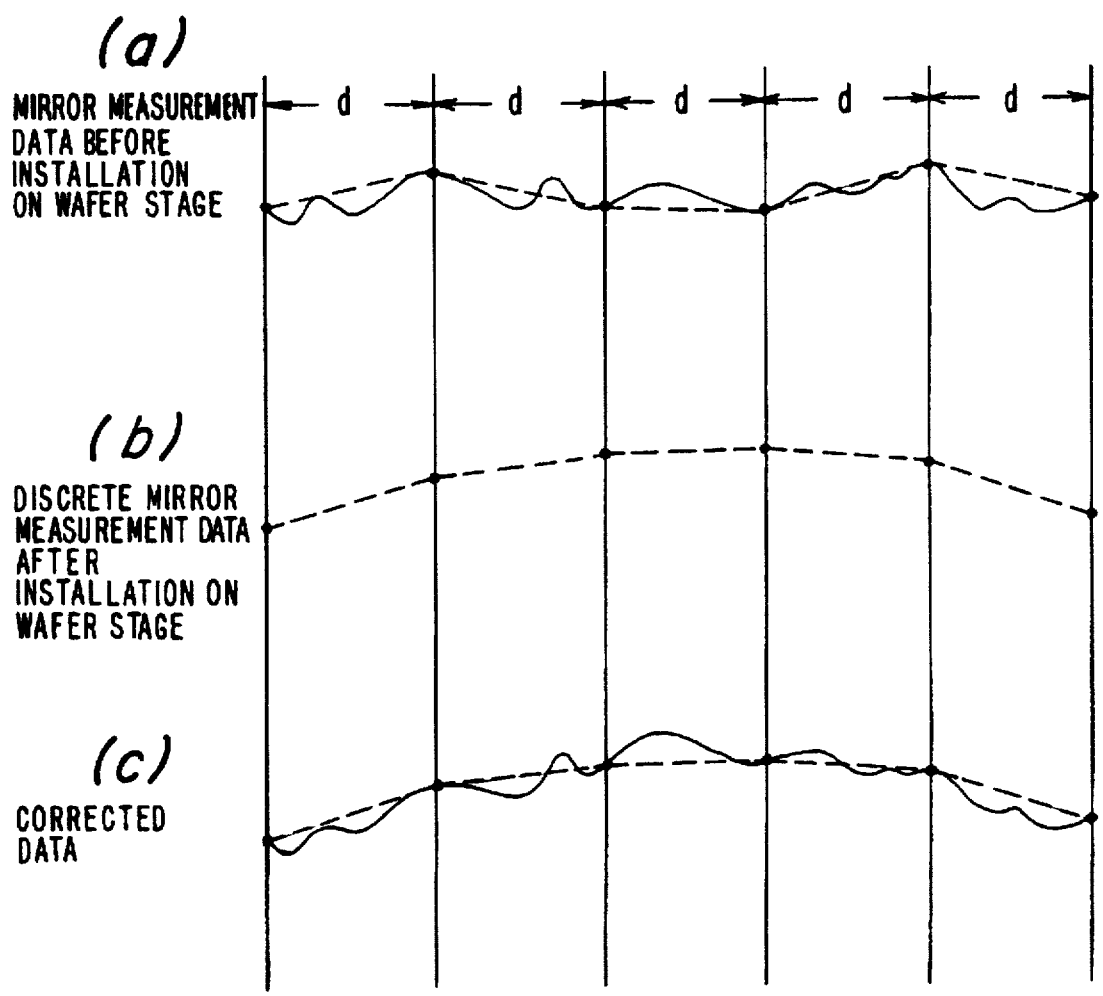
FIG. 4, including
Figure 5:
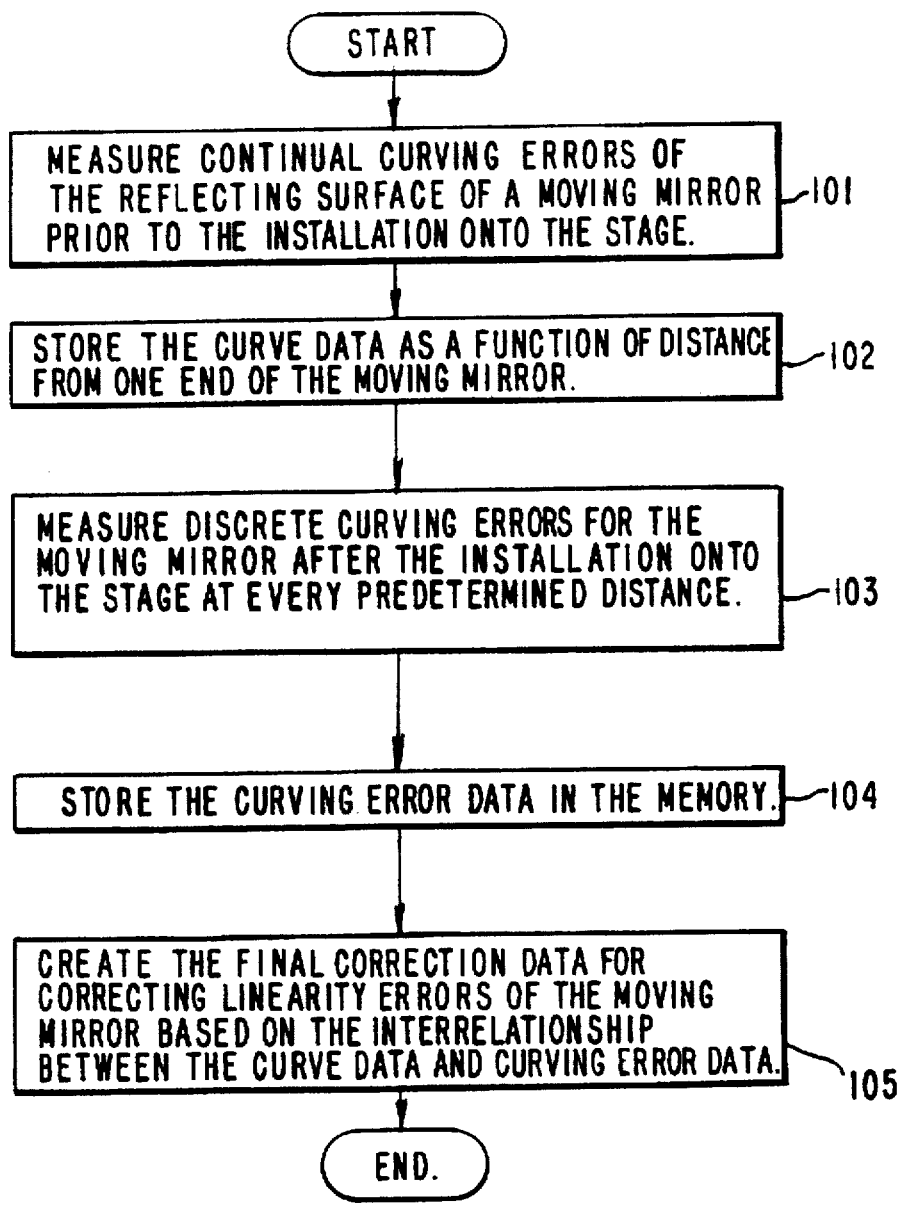
FIG. 5 is a flowchart describing the process of creating the correction data in FIG. 4.

Next, the method of creating correction data for linearity errors of a moving mirror in the present embodiment is described referring to FIGS. 4 and 5.

FIG. 4 shows a diagram which illustrates the principles of creating data for correcting linearity errors of a moving mirror. FIG. 4(a) shows the measurement data of curving errors of the moving mirror prior to the installation onto the stage. FIG. 4(b) shows the discrete measurement data of curving errors after installation onto the stage. FIG. 4(c) shows the final data correcting the linearity errors of the moving mirror. Note that the distance, d, between the six vertical solid lines in FIG. 4 corresponds to the distance between the measuring length axes, d, of the laser interferometers formed on each of the X and Y axial directions. The curving errors of the reflecting surfaces of the moving mirror are greatly magnified to make the deviations clear.

FIG. 5 is a flowchart describing the data creation process regarding the present embodiment. First, in step 101 of FIG. 5, continuous curving errors are measured on the reflecting surface of the mirror before mounting the moving mirror 28 on the wafer stage 14.

Specifically, measurements are taken using a Fizeau interferometer, as shown in FIG. 3, by pointing the reflecting surface of the moving mirror 28, before being mounted onto the wafer stage 14, to the upper level at the point where the object to be measured is such that the moving mirror 28 is influenced by gravity but freed from any additional external force.

As a result, a continuous data of curving errors of the reflecting surface of the moving mirror can be measured before installation on the stage by the aforementioned Fizeau interferometer 40, as shown in FIG. 3. FIG. 4(a) shows the distance, d, (i.e., 30 mm) between the measuring length axes of the laser interferometers. It is clear that there are surface irregularities or curvatures of high spatial frequency resulting from the manufacturing process of the moving mirror. Any high spatial frequency unevenness or curvature as long as the distance, d, or less which exists between the measuring length axes, as shown in FIG. 4(a), is not measurable by conventional technology. Therefore, it has been impossible to correct the displacement caused by the unevenness of the moving mirrors.

The curving error data of the reflecting surface of the moving mirror obtained by the Fizeau interferometer 40 is digitized as a function of distance from one end of the moving mirror 28A, 28B using the A/D converter in the interference belt detector 52 to obtain data which can be processed easily. The resolution of the curving error data in the horizontal direction is determined by the resolution of the interference belt detector 52. Normally, a CCD (charge-coupled device) camera is used for the detector 52. The data in the horizontal direction is naturally discrete and the resolution becomes about 1 mm to about 5 mm. In step 102 of FIG. 5, the curving error data obtained from the moving mirror prior to mounting it onto the stage is stored in a coordinate error table A in the memory 30 (see FIG. 1) connected to the main controller 18 of the exposure apparatus 10.

In the next step 103, of the flowchart of FIG. 5, the curving errors of the reflecting surface of the moving mirror 28 are measured after installation onto the wafer stage 14 as discrete values for each of the predetermined distances.

Specifically, in step 103, each of the moving mirrors 28A, 28B is arranged along the direction of X- and Y-axes on a wafer stage 14, as shown in FIG. 2, after their curving errors have been measured by the aforementioned Fizeau interferometer. The reflecting surfaces of each of the moving mirrors 28A, 28B are deformed after installation onto the wafer stage 14 due to the stress added during installation, causing warping of a low spatial frequency. For this reason, the curving errors of the reflecting surface of the moving mirror 28 are measured after installation onto the stage using the laser interferometers 26 of the exposure apparatus 10. The laser interferometers 26 (26A and 26B, 26C and 26D) used for measurement are arranged in pairs parallel to the directions of the X- and Y-axes at a distance, d, from each other.

For example, as shown in FIG. 2, when measuring the curving errors of the moving mirror 28B facing the direction of the Y-axis, the wafer stage 14 is moved such that the measuring length axes of the laser interferometers 26C, 26D formed in the direction of the Y-axis are projected to the reference position formed at one end of the moving mirror 28B. In this way, the discrete displacement amount of the moving mirror 28B after installation onto the stage is measured in order, using the laser interferometers 26C, 26D while the Y-axis coordinate position of the wafer stage 14 is maintained constant in the direction of the Y-axis by the wafer stage driving system and the wafer stage is moved step-by-step by the distance, d, in order in the direction of the X-axis. The main controller 18 measures the displacement amount by calculating the difference for each of the values measured using the interferometers 26C, 26D.

The discrete displacement amount for each of the distances between measuring length axes of the aforementioned moving mirror 28 is measured by moving the wafer stage 14 step-by-step in the direction of the X-axis, causing yawing. Accurate curving errors for the reflecting surface of the moving mirror can be obtained only when the error values which correspond to the displacement amount (rotation angle) due to yawing itself is subtracted from the aforementioned measured values.

For example, the yawing displacement amount for correcting the measured values of the moving mirror 28B formed on the side of Y can be obtained using the two laser interferometers 26A, 26B provided in the direction of the X-axis. In other words, when measuring the curving errors of the moving mirror 28B on the side of Y, the Y-axis coordinate position of the wafer stage 14 is maintained constant; the wafer stage is moved in the direction of the X-axis dimensionally, such that beams from the laser interferometers 26A, 26B are continued to be projected onto the identical point on the moving mirror 28A. In this way, the main controller 18 can obtain the yawing displacement amount for each of the measurement points by knowing the difference between the laser interferometers 26A, 26B.

By correcting the aforementioned difference data obtained for each of the distances, d, for the moving mirror 28B on the side of Y using the yawing displacement amount of each of the measurement points, the moving mirror 28B, true curving error data can be obtained which does not include the yawing amount.

The discrete data of curving errors of the moving mirror 28B on the side of the Y-axis, as shown in FIG. 4(b) can be obtained by integrating, in order, the curving error data corrected by the above technique.

When measuring the curving error data of the reflecting surface of the moving mirror 28A on the side of X, X and Y are reversed and the same operation used for measuring the curving errors of the reflecting surface of the aforementioned moving mirror 28B on the side of Y can be used. Therefore it is not described.

In step 104, the curving error data of the moving mirrors 28A and 28B obtained by the above technique after installation onto the wafer stage 14 are stored in the coordinate error table B in the memory 30 of the exposure apparatus 10.

The steps shown above measure discrete curving errors for each of the distances between the measuring length axes of the reflecting surface of the moving mirror after installation onto the wafer stage.

In the next step 105, correction data for correcting the linearity errors of the moving mirror is created by the main controller 18. That is, the main controller 18 interpolates the discrete curving error data of the moving mirror stored in the coordinate error table B in the memory 30, after installation onto the stage based on the continuous curving error data of the moving mirror stored in the coordinate error table A in the memory 30, before the installation onto the stage, to create correction data for correcting linearity errors of the moving mirror after installation onto the wafer stage.

Specifically, the main controller 18 specifies the data points in the aforementioned coordinate error table A, as shown in FIG. 4(a), corresponding to the measurement points of the coordinate errors stored in the coordinate error table B, generated after installing the moving mirror. The data in the coordinate error table A are stored as a function of the distance from one end of the moving mirror, and data points which correspond to the measurement points in the coordinate error table B can be specified. The main controller 18 ties each data point with lines (shown in a dotted line) as shown in FIG. 4(a); the difference between the straight line and a datum is referred to as the interpolated data.

Linear interpolation is performed as a baseline interpolation such that the distances between the measurement points in the coordinate error table A shown in FIG. 4(a) are in the same positional relationship as the straight line (shown with dotted lines) in FIG. 4(b) to which the interpolation data created in the coordinate error table A is added to obtain a continuous curving error data of the reflecting surface of the moving mirror after being installed onto the wafer table 14 as shown in FIG. 4(c). This continuous curving error data are the correction data being referred to in the final coordinate error correction phase and are stored in the coordinate error table C in the memory 30.

The steps above are carried out by the method and apparatus in accordance with the principles of the present invention wherein continuous correction data is produced for correcting the linearity errors of the aforementioned moving mirror; wherein combining is performed on the discrete curving error data for the distance between the measuring length axes of the reflecting surface stored in the memory in step 104, and on the data obtained by calculation as a function of distance from one end of the moving mirror stored in the memory in step 102.

Next, the alignment operation (positioning operation) for the wafer W performed prior to exposure in the exposure apparatus 10 of the present embodiment and the method of correcting the position are described.

Referring to FIG. 1, wafer W is aligned such that the main controller 18 controls the wafer stage driving system 16, based on the alignment mark detected by the wafer alignment microscope 32, to align the wafer stage 14 at a predetermined alignment position. The technique called the enhanced global alignment (EGA), which is a global alignment technique using statistical analysis, is used for aligning the wafer stage 14. In this technique, alignment positions in three or more shot regions on a wafer are accurately measured in advance, and all the exposure shot positions on the wafer are determined by statistically analyzing the measurement results.

In the present embodiment, if the reflecting surface of the moving mirror is uneven or warped when identifying coordinates to calculate the alignment mark positions, precision positioning cannot be made. Therefore, to prevent the displacement due to linearity errors of the reflecting surface of the moving mirror, in the exposure apparatus 10 of the present embodiment, unique correction data are created and stored in memory for correcting linearity errors for each of the moving mirrors. The positioning correction is performed based on the correction data detected when measuring the positions of alignment marks on the wafer W using the wafer alignment microscope 32.

As is apparent from the above description, the memory means is constructed with the memory 30 in the present embodiment, and a correction data creation means is constructed with the main controller 18.

As described above, in the method of correcting linearity errors of the moving mirror according to the present embodiment, there is little high spatial frequency deformation component of about 30 mm or less for the mirror deformation caused during installation onto the wafer stage. The curves of a single moving mirror need to be measured prior to the installation using a Fizeau interferometer. Discrete linearity errors are calculated for each of the distances between the measuring length axes for large wavy components generated during the installation of the moving mirror onto the wafer stage. The discrete data of linearity errors of the mirror after installation are interpolated with the curving data of the reflecting surface of the moving mirror prior to the installation such that continuous correction data can be obtained for correcting the linearity errors of the moving mirror after installation onto the wafer stage.

As such, according to the method of correcting linearity errors of a moving mirror of the present embodiment, not only can the large wavy components that exist in the linearity errors of the moving mirror be corrected but also small unevenness of less than the distance between the measuring length axes of a laser interferometer or less or the high spacial frequency component of a large amplitude wave can be corrected. The conventional technology is not capable of making such correction.

In the above embodiment, a linear interpolation is performed for interpolating the baseline between the measurement points in the coordinate error table A, but the present invention is not limited to this embodiment. A "spline interpolation" and the like can be applied.

Also in the above embodiment, the moving mirrors fixed onto the side of the X- and Y-axes of the wafer stage 14 are the "bar mirror" type. However, only one of the mirrors can be the bar mirror and a corner cube can be provided at the position to which a beam from the laser interferometer is irradiated to correct linearity errors on the reflecting surface of the bar mirror.

The above embodiment described the position correction using the correction data used in a stepper which employs the statistical technique called global alignment. However, the present invention is not limited to this embodiment. The present invention can be applied not only to the above-mentioned exposure apparatus but can also be applied to a drawing apparatus for transferring a mask, a mask pattern coordinate measurement apparatus, or other alignment apparatus.

The present invention provides an excellent effect in obtaining the correction data which is capable of accurately correcting the linearity errors of a moving mirror by combining the curving data measured for the reflecting surface of the moving mirror prior to the installation onto a stage by a curving measurement means and the discrete curving error data measured using a laser interferometer for each of the distances between the measuring length axes after installation on the stage while moving the moving mirror fixed onto the stage in the first axial direction substantially identical to the direction toward which the moving mirror extends.

Various modifications will become possible for those skilled in the art after receiving the teachings of the present disclosure without departing from the scope thereof.

The entire disclosure of Japanese Patent Application No. 8-110281, filed Apr. 5, 1996, including the specification, claims, drawings and summary are incorporated herein by reference in its entirety.

What is claimed is:

1. A method of correcting linearity errors of a moving mirror provided on a stage movable in a two-dimensional plane along first and second mutually perpendicular axes, said mirror extending in a first axial direction, said method comprising the steps of:

measuring any shaping errors of the reflecting surface of said mirror before said mirror is installed on said stage;

storing the data resulting from said measuring step in a memory as data which is a function of the distance from one end of said moving mirror;

mounting said mirror on said stage in a preselected position and moving said stage in said first axial direction;

measuring the discrete curving errors data of said reflecting surface of said mirror, as said stage is moved in said first axial direction, by means of a laser interferometer having at least two measuring length axes separated by a predetermined interval in said first axial direction for measuring the second axis coordinate position of said stage, said discrete curving errors data of said mirror being measured for said interval between said measuring length axes;

storing said discrete curving errors data in a memory; and combining said discrete curving errors data of said reflecting surface of said mirror, stored in said memory, with said data which is a function of the distance from one end of said moving mirror, based on the relative positional relationship between said measuring length axes and said preselected position on said stage where said moving mirror is mounted to create a series of correction data for correcting linearity errors of said moving mirror.

2. A method, as claimed in claim 1, including the steps of measuring the amount of displacement of said stage in the rotational direction when said stage is moved in said first axial direction and storing in said memory the difference between the component of displacement in the rotational direction and said discrete curving errors data of said reflecting surface of said mirror.

3. A method, as claimed in claim 1, wherein said measurement of said discrete curving errors data of said mirror by said laser interferometer measures the difference between data measured at each of the positions of said measuring length axes.

4. A method, as claimed in claim 2, wherein said measurement of said discrete curving errors data of said mirror by said laser interferometer measures the difference between data measured at each of the positions of said measuring length axes.

5. A method, as claimed in claim 2, wherein the amount of displacement of said stage in the rotational direction is measured based on the difference between data measured at each of the measuring length axes of said laser interferometer for measuring the first axis coordinate position of said stage.

6. A method, as claimed in claim 1, wherein said shaping errors of the reflecting surface of said mirror are measured by a Fizeau interferometer.

7. A method, as claimed in claim 2, wherein said shaping errors of the reflecting surface of said mirror are measured by a Fizeau interferometer.

8. A method, as claimed in claim 3, wherein said shaping errors of the reflecting surface of said mirror are measured by a Fizeau interferometer.

9. A method, as claimed in claim 4, wherein said shaping errors of the reflecting surface of said mirror are measured by a Fizeau interferometer.

10. A method, as claimed in claim 5, wherein said shaping errors of the reflecting surface of said mirror are measured by a Fizeau interferometer.

11. Apparatus for correcting linearity errors of a moving mirror provided on a stage movable in a two-dimensional plane along first and second mutually perpendicular axes, said mirror extending in a first axial direction, said apparatus comprising:

means for measuring any shaping errors of the reflecting surface of said mirror before said mirror is installed on said stage;

a memory for storing the data resulting from said measuring means as data which is a function of the distance from one end of said moving mirror;

means for mounting said mirror on said stage in a preselected position and for moving said stage in said first axial direction;

a laser interferometer having at least two measuring length axes separated by a predetermined interval in said first axial direction for measuring the second axis coordinate position of said stage, said laser interferometer measuring the discrete curving errors data of said reflecting surface of said mirror for said interval between said measuring length axes, as said stage is moved in said first axial direction, said discrete curving errors data of said mirror being stored in said memory; and a controller for combining said discrete curving errors data of said reflecting surface of said mirror, stored in said memory, with said data which is a function of the distance from one end of said moving mirror, based on the relative positional relationship between said measuring length axes and said preselected position on said stage where said moving mirror is mounted to create a series of correction data for correcting linearity errors of said moving mirror.

12. A stage system comprising:

a stage movable in a two-dimensional plane along first and second mutually perpendicular axes;

means for measuring the discrete data of curving errors in the reflecting surface of a moving mirror before said mirror is mounted on said stage;

a storage means for storing said discrete data of curving errors as data which is a function of the distance from one end of said moving mirror;

means for mounting said moving mirror along said first axial direction of said stage at a predetermined position;

a laser interferometer for irradiating said moving mirror with at least two parallel axes measuring beams at a predetermined distance in said first axial direction; and a correction data-producing means which produces a series of correction data for correcting linearity errors of said moving mirror, said correction data-producing means including:

means for measuring the discrete data of curving errors in the reflecting surface of said moving mirror for each interval between said measuring axes, based on the output from said laser interferometer, while moving said stage in said first axial direction;

a controller for combining said discrete data of curving errors with said data which is a function of the distance from one end of said moving mirror stored in said storage means, based on the relative positional relationship between said measuring axes and said predetermined position where said moving mirror is mounted, to create a series of correction data for correcting linearity errors of said moving mirror.

* * * * *